(12) United States Patent
Sadowski

(10) Patent No.: US 9,455,706 B2
(45) Date of Patent: Sep. 27, 2016

(54) DUAL-RAIL ENCODING

(71) Applicant: Advanced Micro Devices, Inc., Sunnyvale, CA (US)

(72) Inventor: Greg Sadowski, Cambridge, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/313,776

(22) Filed: Jun. 24, 2014

(65) Prior Publication Data

US 2015/0372677 A1    Dec. 24, 2015

(51) Int. Cl.
*H03K 19/00* (2006.01)
*H03K 19/21* (2006.01)

(52) U.S. Cl.
CPC .......... *H03K 19/0002* (2013.01); *H03K 19/21* (2013.01)

(58) Field of Classification Search
CPC .......... G06F 17/5059; G06F 13/4286; H03K 19/0966; H03K 19/0963; H04L 25/4904
USPC .................. 326/56–58; 341/50–107
See application file for complete search history.

(56) References Cited

U.S. PATENT DOCUMENTS

| | | | | |
|---|---|---|---|---|
| 2013/0073771 A1* | 3/2013 | Hanyu | .................... | H04L 25/38 710/305 |
| 2013/0259146 A1* | 10/2013 | Mangano | .............. | H03M 13/51 375/259 |
| 2013/0259166 A1* | 10/2013 | Oh | ....................... | G06F 17/5059 375/340 |
| 2014/0064096 A1* | 3/2014 | Stevens | ................. | G06F 13/385 370/236 |

* cited by examiner

*Primary Examiner* — Alexander H Taningco
*Assistant Examiner* — Seokjin Kim

(57) ABSTRACT

Embodiments may include a method, system and apparatus for providing for encoded dual-rail signal communications in asynchronous circuitry. A dual rail signal pair is received. The dual rail signal pair comprises a first value indicative of a first wait state, a second value indicative of a logic value of a first bit, a third value indicative of a second wait state and a first logic value of a second bit, and/or a fourth value indicative of second wait state and a second logic value of said second bit.

13 Claims, 9 Drawing Sheets

| Wire 1 | Wire 2 | Information |
|--------|--------|-------------|
| 0 | 0 | NULL |
| 0 | 1 | Logic 0 |
| 1 | 0 | Logic 1 |
| 1 | 1 | Not Used |
FIGURE 1
(Prior Art)
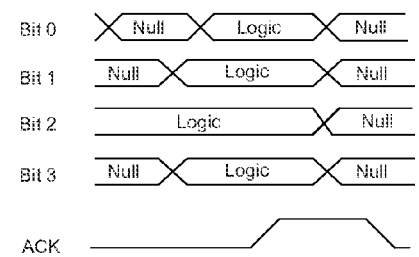
FIGURE 3
(Prior Art)
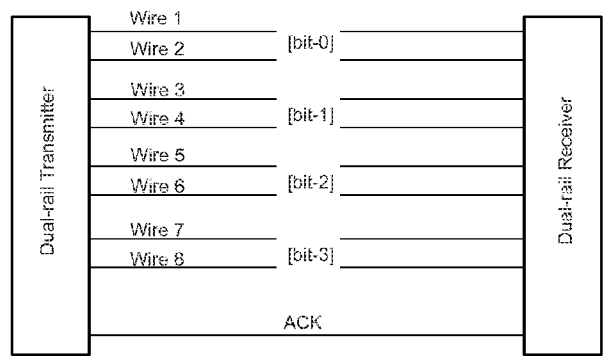
FIGURE 2
(Prior Art)

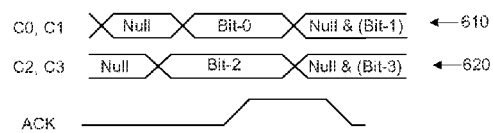
FIGURE 6
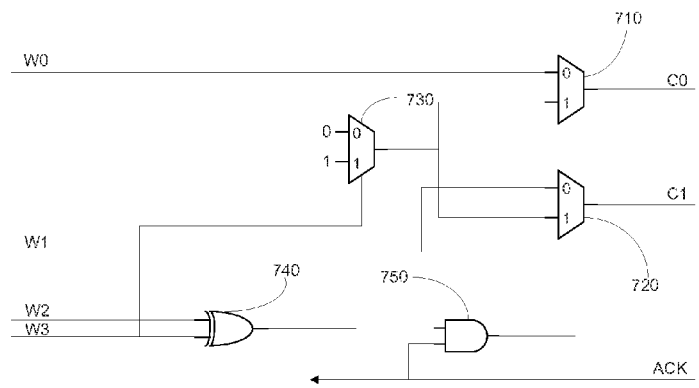
FIGURE 8
FIGURE 7

DUAL-RAIL ENCODING

FIELD OF THE DISCLOSURE

This application relates generally to asynchronous systems, and, more particularly, to encoding dual-rail signals in asynchronous circuitry.

DESCRIPTION OF RELATED ART

There have been many developments in the area of asynchronous architecture and circuits. Asynchronous architecture may be implemented in various devices, such as processors, network devices, portable electronics, etc. Many designers use asynchronous architectures in the CMOS circuitry in order to improve performance and power consumption. In general, dual-rail signaling, which uses two wires for sending one bit of data, is utilized in asynchronous architectures. For example, FIG. 1 illustrates a typical dual-rail signal scheme for asynchronous circuits. Referring to FIG. 1, two wires may represent a single bit with a maximum of four states, wherein three states are typically used for dual-rail signals in asynchronous circuits. For example, a value of "00" with respect to wires 1 and 2 may represent a "NULL" state, which is driven on wires 1 and 2 after valid data has been acknowledged to be received by a dual-rail receiver. When wires 1 and 2 represent the values "01," a logic "0" is interpreted, wherein a value of "10" would provide a logic "1" to a dual-rail receiver. Moreover, generally in asynchronous architecture, the value "11" for wires 1 and 2 are prohibited, and thus, not used. Therefore, in asynchronous architecture, two wires are generally sent from a transmitter to a receiver to convey information relating to a single bit of data.

FIG. 2 illustrates an exemplary prior art transmission of a dual-rail set of signals in an asynchronous circuit. The dual-rail transmitter in the example of FIG. 2 indicates that eight wires (wire 1 through wire 8) are routed from a dual-rail transmitter to a dual-rail receiver. For example, wires 1 and 2 convey the information for bit-0, wires 3 and 4 convey bit-1, wires 5 and 6 convey bit-2, and wires 7 and 8 convey bit-3. Upon reception of the valid signals, the dual-rail receiver may provide and acknowledged signal (ACK) back to the dual-rail transmitter.

FIG. 3 illustrates a typical timing diagram with respect to bits 0 through 3 in relation to the dual-rail transmitter and receiver of FIG. 2. FIG. 3 illustrates that a NULL state may be followed by a logic state where the logic value of bits 0-3 are valid, followed by another NULL state. Upon reception of valid states of bits 0-3, the acknowledge signal (ACK) is asserted. After the dual-rail receiver receives the valid signals, followed by NULL states, the receiver will interpret this as a completed transaction and assert the acknowledge signal (ACK).

As indicated in FIG. 3, each bit requires two wires. Therefore, the cost of space of the semiconductor die under manufacture, as well as the cost of routing asynchronous signals can be very high in terms of utilization of resources. Further, power consumption may be excessive because transmission of signals on two wires for every bit over significant distances on the semiconductor die under manufacture can cause significant loss.

SUMMARY OF EMBODIMENTS

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

Some embodiments may include a method for encoded dual-rail signal communications in asynchronous circuitry. A dual rail signal pair is received. The dual rail signal pair comprises a first value indicative of a first wait state, a second value indicative of a logic value of a first bit, a third value indicative of a second wait state and a first logic value of a second bit, and/or a fourth value indicative of second wait state and a second logic value of said second bit.

Some embodiments may include an apparatus for providing for encoded dual-rail signal communications in asynchronous circuitry. The apparatus may comprise a receiving portion adapted to receive a dual rail signal pair. The dual rail signal pair may comprises a first value indicative of a first NULL state, a second value indicative of a logic value of a first bit, a third value indicative of a second NULL state and a first logic value of a second bit, and/or a fourth value indicative of second NULL state and a second logic value of said second bit.

Some embodiments may include an integrated circuit device for providing for encoded dual-rail signal communications in asynchronous circuitry. The integrated circuit device comprises a processor for executing an instruction. The processor comprises a receiving portion adapted to receive at least one of a dual rail signal pair. The dual rail signal pair comprises a first value indicative of a first NULL state, a second value indicative of a binary value of a first bit, a third value indicative of a second NULL state and a first binary value of a second bit, and/or a fourth value indicative of second NULL state and a second binary value of said second bit.

BRIEF DESCRIPTION OF THE DRAWINGS

The disclosed subject matter may be understood by reference to the following description taken in conjunction with the accompanying drawings, in which like reference numerals identify like elements, and in which:

FIG. 1 illustrates a prior art table of an exemplary definition of dual-rail signal pair;

FIG. 2 illustrates a stylized block diagram depiction of transmission and reception of dual-rail signals;

FIG. 3 illustrates a prior art timing diagram associated signals transmitted with respect to a dual-rail transmitter and a dual-rail receiver;

FIG. 6 illustrates a timing diagram of a data transmission relating to the circuit of FIG. 5, in accordance with some embodiments;

FIG. 7 illustrates an exemplary circuit diagram for encoding dual-rail bits, in accordance with some embodiments herein;

FIG. 8 illustrates an exemplary timing diagram of an encoded dual-rail signal, in accordance with some embodiments herein;

Figure 4:
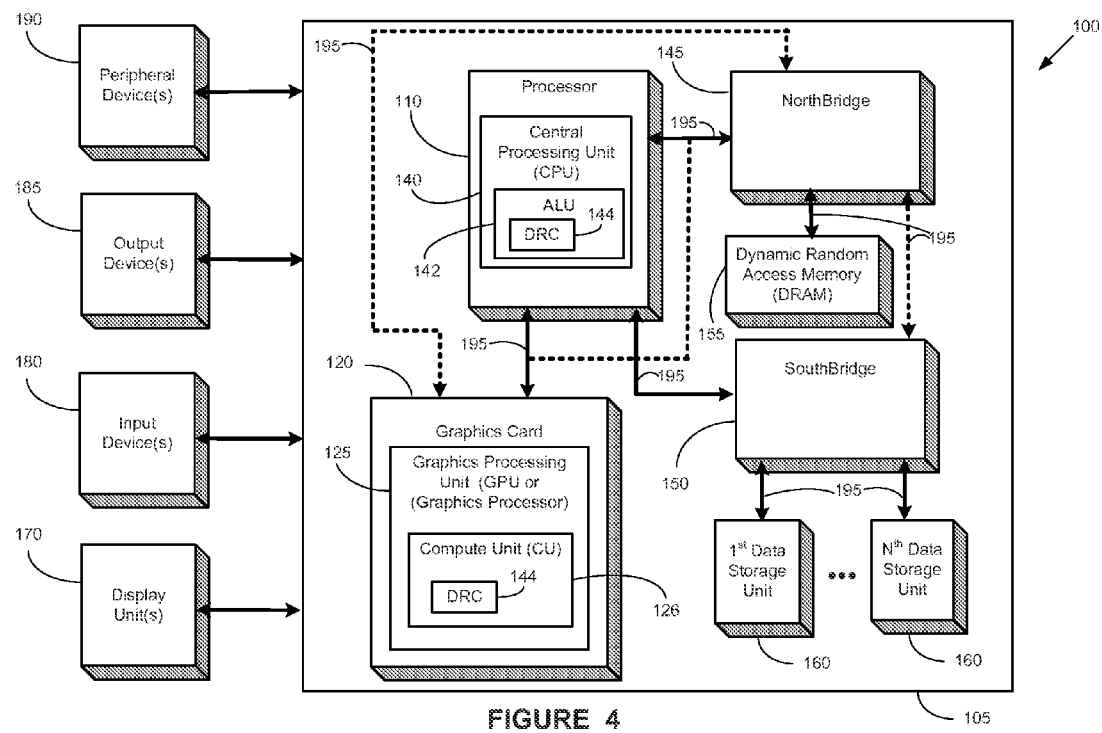
FIG. 4 illustrates a system comprising a processor and a graphics card, in accordance with embodiments herein.

While the disclosed subject matter may be modified and may take alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION

Illustrative embodiments are described below. In the interest of clarity, not all features of an actual implementation are described in this specification. It should be appreciated that in the development of any such actual embodiment, numerous implementation-specific decisions should be made, which may vary from one implementation to another. Moreover, it should be appreciated that such a development effort might be complex and time-consuming, but would nevertheless be a routine undertaking for those of ordinary skill in the art having the benefit of this disclosure. The description and drawings merely illustrate the principles of the claimed subject matter. It should thus be appreciated that those skilled in the art may be able to devise various arrangements that, although not explicitly described or shown herein, embody the principles described herein and may be included within the scope of the claimed subject matter. Furthermore, all examples recited herein are principally intended to be for pedagogical purposes to aid the reader in understanding the principles of the claimed subject matter and the concepts contributed by the inventor(s) to furthering the art, and are to be construed as being without limitation to such specifically recited examples and conditions. The word "exemplary" is intended to serve as one example and not to limit the application by construing the example or embodiment as preferred or advantageous over other embodiments.

The disclosed subject matter is described with reference to the attached figures. Various structures, systems and devices are schematically depicted in the drawings for purposes of explanation only and so as to not obscure the description with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition is expressly set forth in the specification in a definitional manner that directly and unequivocally provides the special definition for the term or phrase. Additionally, the term, "or," as used herein, refers to a non-exclusive "or," unless otherwise indicated (e.g., "or else" or "or in the alternative"). Also, the various embodiments described herein are not necessarily mutually exclusive, as some embodiments can be combined with one or more other embodiments to form new embodiments.

As discussed herein, conventional dual-rail transmission can lead to a high cost of space on the semiconductor die under manufacture. Further, the cost of routing asynchronous signals utilizing conventional dual-rail transmission can be very high in terms of utilization of resources. Further, power consumption may be excessive in conventional dual-rail transmission.

FIG. 4 conceptually illustrates a computer system 100, according to some embodiments. The computer system 100 may be a personal computer, a laptop computer, a handheld computer, a netbook computer, a mobile device, a tablet computer, a netbook, an ultrabook, a telephone, a personal data assistant (PDA), a server, a mainframe, a work terminal, a smart television, or the like. The computer system includes a main structure 105 which may be a computer motherboard, system-on-a-chip, circuit board or printed circuit board, a desktop computer enclosure or tower, a laptop computer base, a server enclosure, part of a mobile device, tablet, personal data assistant (PDA), or the like. The computer system 100 may run an operating system such as Linux®, Unix®, Windows®, Mac OS®, or the like.

In some embodiments, the main structure 105 includes a graphics card 120. For example, the graphics card 120 may be an ATI Radeon™ graphics card from Advanced Micro Devices ("AMD"). The graphics card 120 may, in different embodiments, be connected on a Peripheral Component Interconnect (PCI) Bus (not shown), PCI-Express Bus (not shown), an Accelerated Graphics Port (AGP) Bus (also not shown), or other electronic or communicative connection. The graphics card 120 may include a graphics processing unit (GPU) 125 used in processing graphics data. The graphics card 120 may be referred to as a circuit board or a printed circuit board or a daughter card or the like.

The computer system 100 may comprise a processor 110, in accordance with some embodiments, is illustrated. Modern computer systems may exist in a variety of forms, such as telephones, tablet computers, desktop computers, laptop computers, servers, smart televisions, or other consumer electronic devices. The processor unit 110 may comprise one or more central processing units (CPUs) 140. The CPU 140 is capable of performing memory operations using the unified store queue taught herein.

The CPU(s) 140 may be electronically or communicatively coupled to a northbridge 145. The CPU 140 and northbridge 145 may be housed on the motherboard (not shown) or some other structure of the computer system 100. In some embodiments, the graphics card 120 may be coupled to the CPU 140 via the northbridge 145 or some other electronic or communicative connection. For example, CPU 140, northbridge 145, GPU 125 may be included in a single package or as part of a single die or "chip". The northbridge 145 may be coupled to a system RAM (or DRAM) 155 or the system RAM 155 may be coupled directly to the CPU 140. The system RAM 155 may be of any RAM type known in the art; the type of system RAM 155 may be a matter of design choice. The northbridge 145 may be connected to a southbridge 150. The northbridge 145 and southbridge 150 may be on the same chip in the computer system 100, or the northbridge 145 and southbridge 150 may be on different chips. The southbridge 150 may be connected to one or more data storage units 160. The data storage units 160 may be hard drives, solid state drives, magnetic tape, or any other non-transitory, writable media used for storing data. In various embodiments, the CPU 140, northbridge 145, southbridge 150, GPU 125, or system RAM 155 may be a computer chip or a silicon-based computer chip, or may be part of a computer chip or a silicon-based computer chip. The various components of the computer system 100 may be operatively, electrically, or physically connected or linked with a bus 195 or more than one bus 195. Some embodiments of the buses 195 may be result buses that are used to convey results of operations performed by one functional entity in the computer system 100 to another functional entity in the computer system 100.

The computer system 100 may be connected to one or more display units 170, input devices 180, output devices 185, or peripheral devices 190. These elements may be internal or external to the computer system 100, and may be wired or wirelessly connected. The display units 170 may be internal or external monitors, television screens, handheld device displays, touchscreens, and the like. The input devices 180 may be any one of a keyboard, mouse, trackball, stylus, mouse pad, mouse button, joystick, touchscreen, scanner or the like. The output devices 185 may be any one of a monitor, printer, plotter, copier, or other output device. The peripheral devices 190 may be any other device that can be coupled to a computer. Example peripheral devices 190 may include a CD/DVD drive capable of reading or writing to physical digital media, a USB device, Zip Drive, external hard drive, phone or broadband modem, router/gateway, access point or the like.

The GPU 125 and the CPU 140 may implement various functional entities including one or more processor cores, floating-point units, arithmetic logic units, load store units, translation lookaside buffers, instruction pickers, or caches such as L1, L2, or L3 level caches in a cache hierarchy.

Various portions of the system 100 described above may utilize asynchronous transmission of dual-rail signals. Concepts with regard to dual-rail encoding described herein may be applied to those portions. For example, the CPU 140 in the processor 110 may comprise an arithmetic logic unit (ALU) 142. In some embodiments, the ALU 142 may provide for asynchronous execution of operations. Therefore, the ALU 142 may comprise a dual-rail signal circuitry for transmission of dual-rail asynchronous signals. The ALU 142 may comprise a dual-rail converter (DRC) 144. The DRC 144 may be capable of encoding and/or decoding dual rail signals in such a manner that a substantial portion of the transmission of dual rail signal may be made using a fewer number of transmission wires or signal lines. Some embodiments of the DRC 144 are illustrated in greater detail below.

Moreover, the graphics processing unit (GPU) may comprise one or more compute units (CU) 126. The CU 126 may perform various operations, e.g., mathematical operations. In some embodiment, these operations of the CU 126 may be performed using asynchronous circuits, utilizing dual-rail signals. Therefore, the CU 126 may also comprise dual-rail circuitry, which may comprise a DRC 144.

Figure 5:
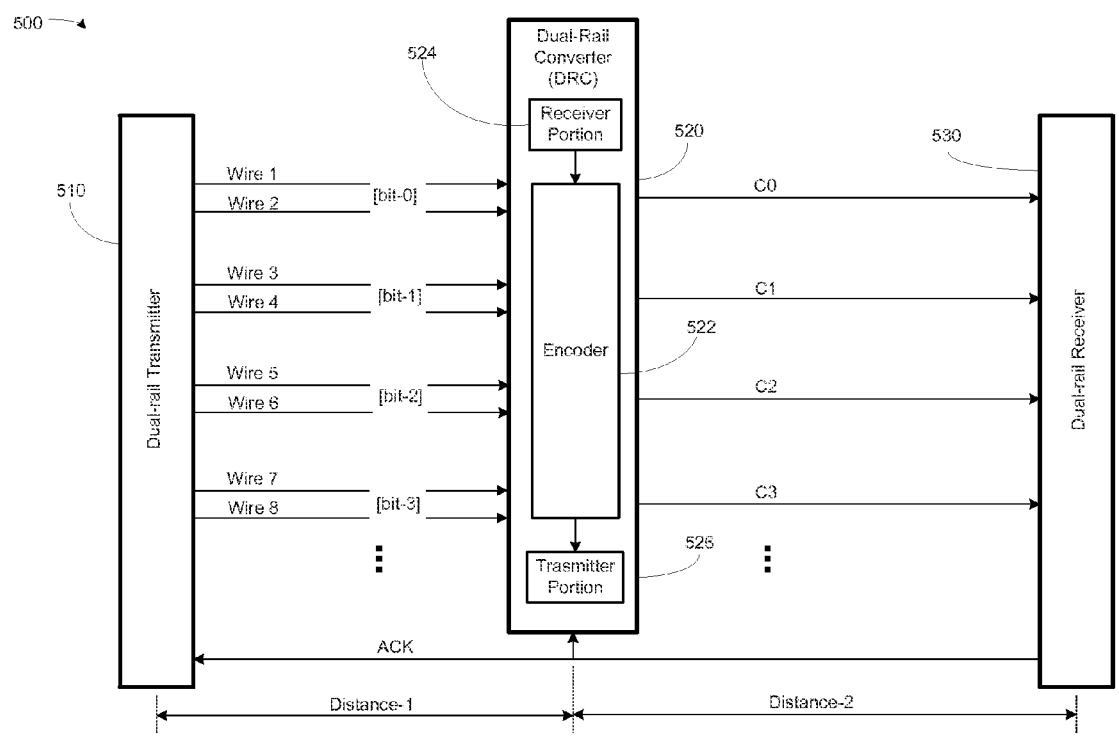
FIG. 5 illustrates a stylized block diagram depiction of a dual-rail transmitter and receiver comprising a dual-rail converter (DRC) in accordance with some embodiments herein.

Turning now to FIG. 5, a stylized block diagram depiction of a dual-rail circuitry, comprising dual-rail transmitter, dual-rail receiver, and a dual-rail converter (DRC) in accordance with some embodiments herein, is illustrated. In one embodiment, the dual-rail circuitry 500 of FIG. 5 may comprise a dual-rail transmitter 510 for transmitting dual-rail signals, and a dual-rail receiver 530 for receiving the dual-rail signals. The dual-rail circuitry 500 may also comprise a DRC 520 for encoding and/or decoding various signals transmitted from the transmitter 510 to the receiver 530. The diagram in FIG. 5 illustrates an exemplary four-bit transmission, using eight wires. However, those skilled in the art would appreciate that although the description of FIG. 5 is provided in the context to an exemplary 4-bit transmission, a variety of number of signals may be processed by the circuitry 500.

The dual-rail transmitter 510 may transmit bit-0 through bit-3. Each of the bits 0-3 may be represented by two wires (i.e., wires 1 and 2 for bit-0; wires 3 and 4 for bit-1; wires 5 and 6 for bit-2; wires 7 and 8 for bit-3). The signals on wires 1-8 are transmitted to the DRC 520. The DRC 520 may comprise a receiver portion 524 capable of receiving signals from the dual-rail transmitter. The DRC 520 may also comprise an encoder 522 may be capable of performing encoding of the dual-rail signals. The DRC 520 may also comprise a transmitter portion to transmit encoded signals to the dual-rail receiver 530.

In one embodiment, encoder 522 of the DRC 520 may encode each of the bits 0 through 3. The encoder 522 is capable of manipulating the value of the NULL signal to provide for an effective reduction of the number of wires used for each of the bits 0-3. As noted above, generally, the NULL signal in the state-of-the art was only defined by the value "00" for the two wires that represented a single bit. Accordingly, the timing of a particular dual-rail bit would have been a NULL value ("00"), followed by a logic value of 1 or 0, followed by another NULL state ("00"), and so on.

In one embodiment, the NULL state may refer to valid state where the logic-level of a previously valid bit is not valid, but nevertheless, it is recognized as a valid state that is indicative of a transition from one valid state of a bit to another. The NULL state may refer to a state where there is no logic level assigned to a previously valid bit, i.e., a temporary wait state, while waiting for the next moment where the logic level of that bit is again valid, i.e., a transition period. The wait state may refer to a state during which the logic level of a first bit is not valid, however, using the dual-rail encoding scheme provided herein, a valid logic level of a second bit may be provided during the wait state. The value of the second bit may be deciphered from the value of the wait state (either a "00" or a "11"). In some embodiments, the NULL state may be a high-impedance state, wherein during the data valid states, the wire may be forced to a logic-high state or to a logic-low state (e.g., pulled up or pulled down).

Embodiments herein provide for using a value of either "00" or "11" relating to the two wires that represent a single dual-rail bit, to define a NULL state. Utilizing this technique, embodiments herein provide for reducing the number of wires that represent each bit by half. This may be achieved by encoding the NULL word between every valid data in one data signal (or bit), which is represented by two wires, with the logic value from an adjacent data signal/bit. Using the encoding techniques described in further details below, the DRC 520 is capable of encoding the eight wires (wire 1-8) that represent bits 0-3, to four signals/wires (C0-C3), as illustrated in FIG. 5. The DRC 520 is capable of conveying the information of bits 0-3 from wires 1-8, as well as the intervening NULL states, such that the dual-rail receiver 530 in one embodiment receives only four wires, while still receiving the information of bits 0-3, as well as the NULL states. In this manner, a significant reduction in the usage of die space and wire resources may be realized while still maintaining the asynchronous transmission of data. Moreover, using fewer wires for transmission provides for power savings in the asynchronous circuit.

FIG. 6 illustrates a timing diagram representative of the transmission of the encoded bits and NULL states provided by the encoder 522, in accordance with some embodiments. Referring simultaneously to FIGS. 5 and 6, the bits 0-3, as well as the NULL states, are conveyed using the four signals C0-C3. This may be achieved by converting the full parallel transmission of bits 0-3 into two sets of serial transmission.

FIG. 6 illustrates two serial lines 610 and 620 that are in parallel to each other. The serial line (610) may comprise the state of bit-0, followed by a NULL state, as well as the state of bit-1, as indicated in FIG. 6. The serial line 610 is in parallel with another serial line 620, which comprises the state of bit-2, followed by the NULL state and the state of bit-3, as illustrated in FIG. 6. That is, C0 and C1 may be used to encode the value of bit-0, wherein if the value of C0, C1 equals to "01," then the value of bit-0 is logic "0." If the value of C0, C1 equals to "10," the value of bit-0 equals to logic "1." However, instead of the following the bit-0 state with a NULL value of "00," the encoder may utilize the value of bit-1 to determine the value of the NULL state. For example, if the value of bit-1 is logic "1," then the encoder may set the value of the NULL state after the bit-0 state, to "11," capitalizing on the existing logic "1" value of bit-1. However if the value of bit-1 is logic "0," then the NULL value after bit-0 will be "00," capitalizing on the existing logic "0" value of bit-1. In this manner, the value of the NULL state may be conveyed simultaneously with conveying the value of bit-1. Therefore, what would have required four wires (i.e., wires 1-4), which would have been used to convey the value of bit-0, the value of the subsequent NULL state, and the value of bit-1, now only requires two wires (i.e., C0 and C1). That is, using the encoding of embodiments herein, the values of bit-0, the NULL state, and bit-1 value are now all represented by only two wires (C0 and C1), wherein bit-0 is conveyed, followed by the NULL state value, which is also indicative of the value of bit-1.

Similarly, the encoder 522 may use the value of C2 and C3 to represent the value of bit-2. For example, if C2 and C3 equal "01," then the value of bit-2 is logic "0." If the value of C2 and C3 equals to "10," then the value of bit-2 is logic "1." Similarly, as above, the value of bit-2 may be followed by a NULL state, which then would be recognized by the dual-rail receiver 530 as having completed receiving the valid value of bit-2. Further, the value of this NULL state will depend on the value of bit-3. If the value of bit-3 is logic "1," the encoder will set the value of the NULL state to "11." If the value of bit-3 is logic "0," the encoder will set the value of the NULL state to "00." Therefore, what would have required four wires (i.e., wires 5-8), which would have been used to convey the value of bit-2, the value of the subsequent NULL state, and the value of bit-3, now only requires two wires (i.e., C2 and C3). That is, using the encoding of embodiments herein, the values of bit-2, NULL state, and bit-3 are now represented by only two wires (C0 and C1), wherein bit-2 is conveyed, followed by the NULL state value, which is also indicative of the value of bit-3.

In this manner, eight wires (wires 1-8) that represent bit-0 through bit-3, as well as their respective NULL states, can be encoded such that the information of bits 0-3 and their NULL values are represented by four wires (C0-C3). Upon the expiration of the NULL state post-bit-0 state, and the NULL state post-bit-2, the next value of bit-0 and bit-2 may occur, which indicates that the NULL states are now over. Therefore, the receiver 530 is capable of determining when to accept the values of bits 0-3, and when the NULL states take place. Accordingly, wires 1 through 8 can be replaced by four wires (C0-C3), utilizing the encoder 522. Upon receiving valid data is (bit-0, NULL/bit-1, bit-2, NULL/bit-3), the acknowledge signal ACK is asserted and then de-asserted, indicating the data has been received, the NULL states have been reached, and the receiver 530 is ready to receive new data.

The technique described above may be used to reduce the amount of wires that must be formed on a semiconductor die; thereby saving space and reducing resources used on the die. Further, power consumption may be realized since less wiring is used to transmit the same amount of signals, thereby reducing loss. In order to obtain savings in resources, the DRC 520 may be positioned closer to the dual-rail transmitter 510 as compared to its relative distance to the dual-rail receiver 530. As indicated in FIG. 5, the distance between the dual transmitter 520 and the DRC 520 may be "distance-1," whereas, the distance between the DRC 520 and the dual-rail receiver 530 is "distance-2," which is a greater than distance-1. Therefore, the eight wires (wires 1-8) from the dual-rail transmitter 510 travel a relatively small distance, wherein after the encoding performed by the DRC 520, only four wires (C0-C3) travel a further distance while carrying the same amount of information.

Turning now to FIG. 7, a circuit diagram depicting an exemplary circuit that may be used to perform the encoding described in FIGS. 5 and 6, in accordance with some embodiments herein, is illustrated. FIG. 7 illustrates converting dual-rail signals on four wires (W0-W3) into two converted signals (C0-C1). The signal on wire 0 (W0) may be fed into a multiplexer, wherein wire 1 (W1) may be fed into an input of a second multiplexer 720. The output of the multiplexer 710 and 720 are the converted/encoded output wires C0 and C1. The second input into the multiplexers 710 and 720 may be provided by the output of multiplexer 730, which may be 0 or 1, depending on the select value, which may be the value of W3. Therefore, when W3 is low, the value of "0" may be provided by the multiplexer 730. The select inputs of multiplexer 710 and 720 may be controlled by an output from an AND gate 750. The AND gate 750 may have an input that is the value of the acknowledge signal (ACK), provided by the dual-rail receiver 530. The other input to the AND gate 750 may be the output of an XOR gate 740. The inputs to the XOR gate 740 may be W2 and W3.

Utilizing the circuit of FIG. 7, the timing diagram represented by FIG. 8 may be provided. The timing diagram of FIG. 8 may be the value of bit-0 represented by W0 and W1, followed by a NULL state, which also conveys the value of bit-1, which was originally represented by W2 and W3. Therefore, for example, the timing diagram may provide a null state of "00," followed by a logic level of bit-0, followed by a NULL state of "11," which may indicate that bit-1 is equal to 1. This may be followed by the logic state of bit-0, followed by another NULL state, in this example "11," which also indicates that bit-1 has the value of logic "1." Therefore, the circuit provided by FIG. 7 may be used by the DRC 520 to encode four wires into two serial lines, which may be a representation of the value of bit-0, followed by a NULL state, which simultaneously provides the value of bit-1.

The embodiments provided herein for encoding a dual-rail signal may also be used to increase throughput of data in asynchronous circuitry. Continuing referring to FIG. 8, the null state which follows a logic state may be "00" or "11," and may be used to convey additional information, for example, relating to the logic bit. Utilizing the concept with regard to the NULL state being defined by "00" or "11" and the two wires that define a single bit, the NULL state may then be used as an additional bit of information. This additional bit may convey a variety of data, such as a configuration state, a state of a circuit, a status bit, etc.

Accordingly, using existing two-rail communication channels, embodiments herein may provide for encoding the information on the dual-rail single channel to provide additional information during NULL states, thereby increasing the bandwidth of the dual-rail channel. Since the dual-rail receiver 530 (FIG. 5) receives the logic value for a particular bit, as well as the NULL state, adding additional information during the NULL state increases the amount of information that the dual-rail receiver 530 receives from the dual-rail wires. Therefore, utilizing embodiments provided herein, utilizing the NULL state to provide additional information provides for effectively adding an additional data channel that uses the time intervals between valid dual-rail signals to convey an extra bit. This NULL data (00 or 11) may be decoded by the dual-rail receiver, or a separate dual-rail decoder that may precede the dual-rail receiver 530.

Figure 10:
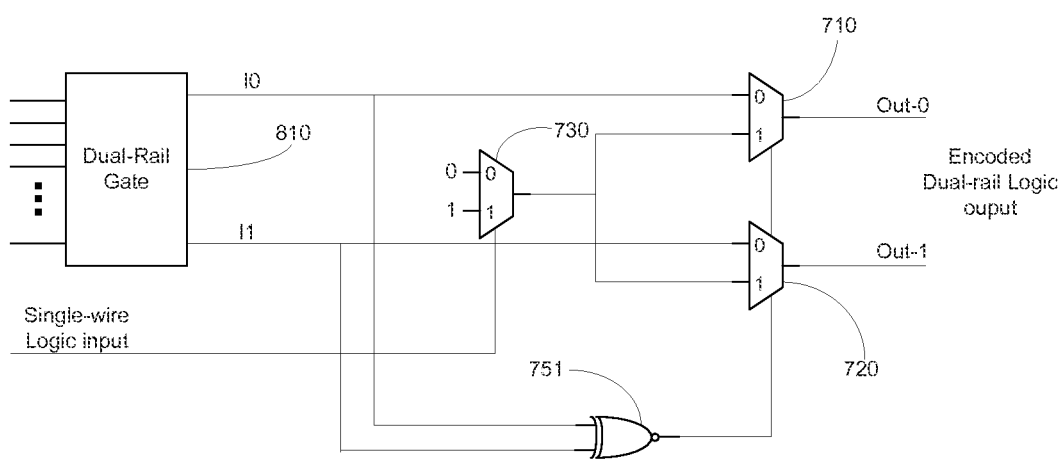
FIG. 10 illustrates a block diagram depiction of a dual-rail circuit, including a dual-rail encoder and a dual-rail decoder, in accordance with some embodiments herein.
Figure 11:
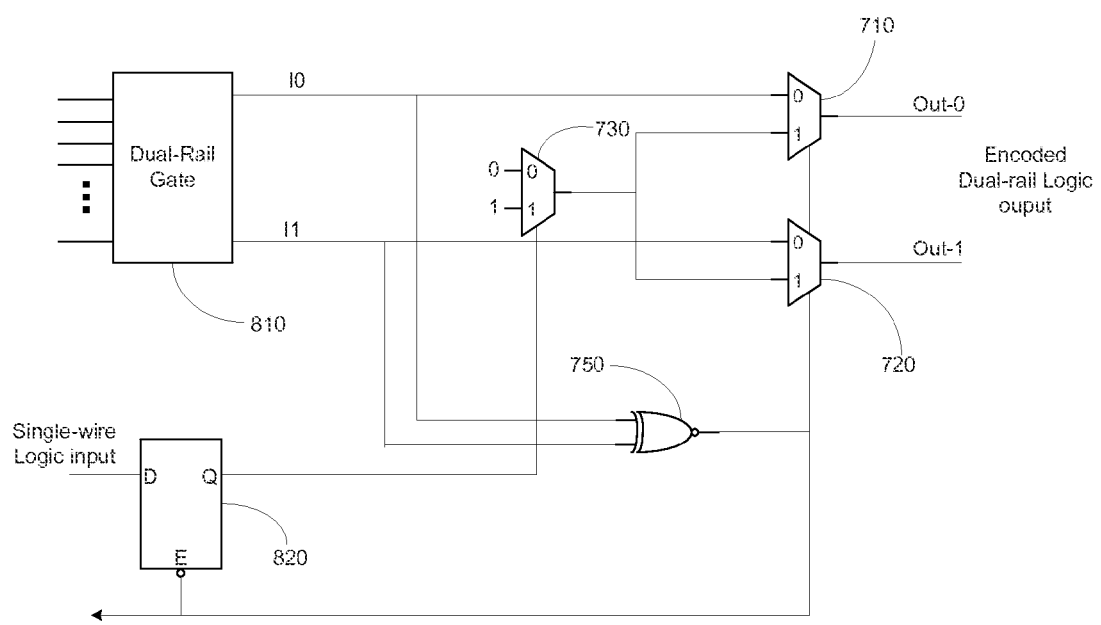
FIG. 11 illustrates an exemplary circuit diagram of a dual-rail signal encoder comprising a latch, in accordance with some embodiments herein.

Examples of a signal encoder that is capable of encoding dual-rail signals to provide for bit information, as well as additional information during a NULL state, may be found in FIGS. 10 and 11. Example of a decoder that decodes information from the encoder is found in FIG. 12, as described below.

Figure 9:
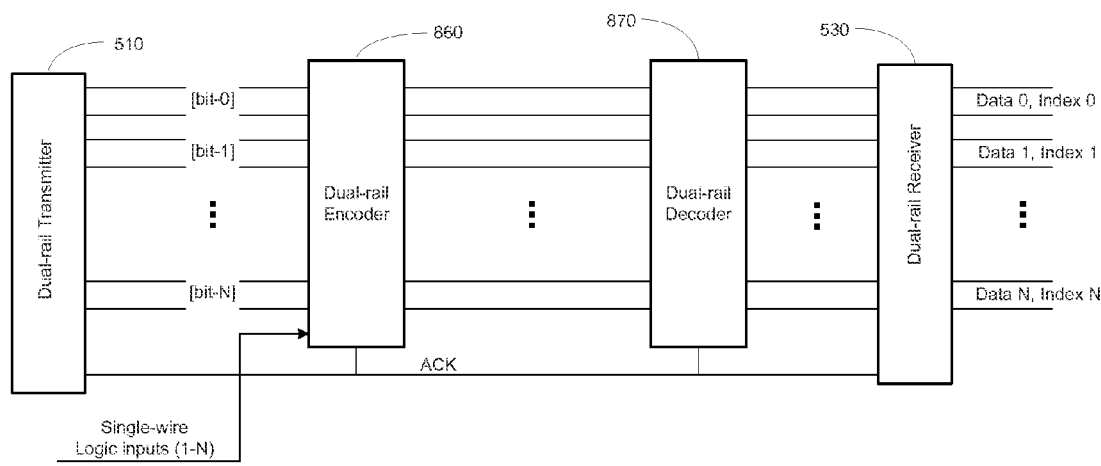
FIG. 9 illustrates an exemplary circuit diagram of a dual-rail signal encoder for transmitting dual-rail signals.

Turning now to FIG. 9, one example of a configuration of an asynchronous circuit comprising a dual-rail transmitter, a dual-rail encoder, a dual-rail decoder, and a dual-rail receiver, in accordance with some embodiments herein, is illustrated. Data from the dual-rail transmitter 510 is provided to a dual-rail encoder 860. Bit-0, bit-1 through bit-N may be transmitted to the dual-rail encoder 860. Each of the bits 0 through N, are conveyed using two wires each. The dual-rail encoder 860 is capable of encoding information from each of the dual-rail wires sets representing each bit (bits 0-N), in such a manner that between valid data, the NULL states convey a data value of "00" or "11," wherein these NULL state values may be decoded to represent a logic 0 (logic low) or a logic 1 (logic high) associated with a particular bit from the group bits 1-N.

As shown in FIG. 9, the dual-rail encoder 860 may receive one or more single-wire logic inputs, in some cases, one for each of the bits 1-N. The dual-rail encoder 860 may then encode the value of the single-wire logic input for each corresponding bit 1-N onto the respective two-wires that represent the corresponding bits 1-N. Therefore, the dual-rail encoder 860 will encode and convey the value of each of the bits 1-N, as well as the value of the corresponding single-wire input value, onto each corresponding dual-wire sets. This information may be decoded by the dual-rail decoder 870. In one embodiment, the dual-rail encoder 860 may serialize the transmission as described above in order to reduce wire count, which may then be decoded from serial back to parallel before providing the dual-rail wires to the dual-rail receiver 860. In an alternative embodiment, the encoder may encode the sign-wire logic inputs onto the information conveying the bit 1-N states and the NULL states, keeping them in a parallel form and sending them directly to the dual-rail receiver 830 without an intervening dual-rail decoder 870.

The output of the dual-rail decoder 870 may be sent to the dual-rail receiver 530, which is capable of receiving data value of each bit, bit-0 through bit-N, represented by the dual-rail pair wires. Therefore, bit-0 may be encoded by the dual-rail encoder 860 such that the value of bit-0 as well as an additional bit, such as an index or a status bit, is provided to the dual-rail decoder 870. The dual-rail decoder 870 may then decode and send this information to the dual-rail receiver 530. For example, the dual-rail receiver 870 will receive "data 0," which represents the value of bit-0, as well as an additional bit of information, such as "index 0," as shown in FIG. 9. In this manner, the dual-rail receiver receives "data 0, index 0" from the wires representing bit-0; "data-1, index-1" from the wires representing bit-1; "data-N, index-N" from the wires representing bit-N, etc., as indicated in FIG. 9. Therefore, using the existing dual-rail wires, additional information (extra bit during the NULL state) from a single-wire logic may be transmitted, thereby increasing the bandwidth of dual-rail transmission.

Turning now to FIG. 10, an exemplary circuit representation of a dual-rail signal encoder, in accordance with some embodiments, is provided. The circuit of FIG. 10 may receive two-bits from a dual-rail gate 810. In one embodiment, the dual-rail gate 810 may be a part of the dual-rail transmitter 510. The dual-rail gate 810 provides an input bit-0 (I0) and an input bit-1 (I1), which are provided as the "0" inputs into multiplexers 710 and multiplexers 720, respectively. Further, a single-wire logic input, which comprises the additional data that is to be transmitted during the NULL state, may be provided to a multiplexer 730 as a select input. The single-wire logic input may represent a status bit, a counter bit, etc.

The inputs to the multiplexer 730 may be a "0" value and a "1" value. The output of the multiplexer 730 is provided as the second input to the multiplexor 710 and the multiplexer 720. The input bits (I0 and I1) may be provided to an XNOR gate 751. The output of the XNOR gate 750 is provided as a select signal to the multiplexors 710 and 720. The output of the multiplexors 710 and 720 provide an output dual-rail signal ("Out-0" and "Out-1"), which may represent the logic value of a bit and the additional single-wire logic input value during a NULL state. In this manner, the data value of the bit, as well as an additional single-wire logic input (e.g., status bit), is provided via the dual-rail pair Out-0 and Out-1.

Turning now to FIG. 11, another example of a dual-rail encoder 860 comprising a sampling latch, in accordance with some embodiments, is illustrated. The input signals from the dual rail gate 810 are provided to the multiplexors 710 and 720 in a similar fashion as described above with respect to FIG. 10. Further, the select signal is provided by the XNOR gate 750 in a similar manner as described above with respect to FIG. 10.

The example of FIG. 11 comprises a sampling latch 820. The enable input into the sampling latch 820 is the output of the XNOR gate inverted. The sampling latch receives the single-wire logic input that is to be transmitted during the NULL state. Based on the enabling signal of the sampling latch 820, the single-wire logic input is provided from the D-input of the Latch 820, to the output of the sampling latch 820. The output of the sampling latch 820 is provided to the multiplexer 730 in similar manner described above in FIG. 10. Therefore, the output of the multiplexor 730 comprises the value of the single-wire logic input that is to be transmitted and decoded during the null state. In this manner, the output of the multiplexors 710 and 720, provide the value of the input wires I0 and I1, along with the value of the single-wire logic input during the NULL state of the transmission provided by the dual-wires Out-0 and Out-1.

Figure 12:
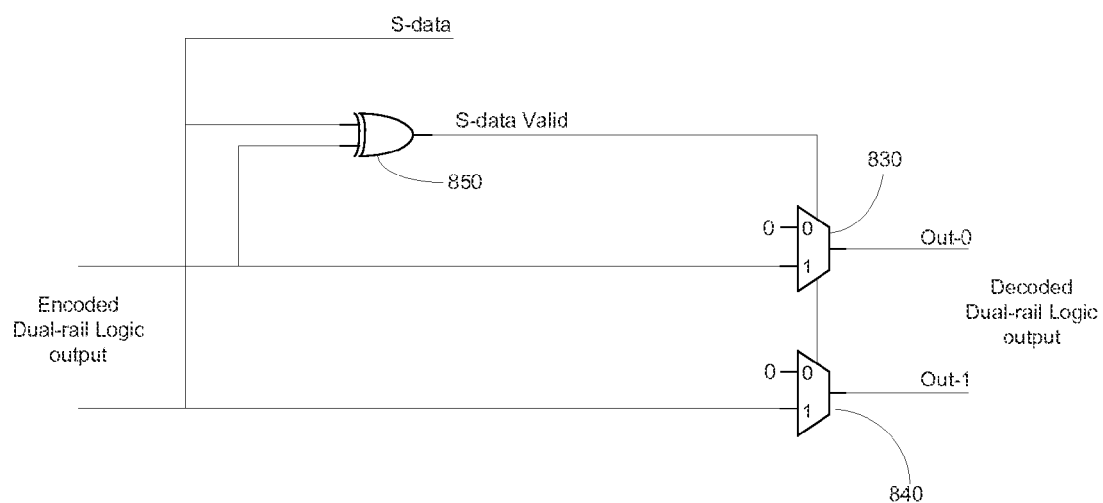
FIG. 12 illustrates an exemplary circuit diagram of a dual-rail signal decoder, in accordance with some embodiments herein.

Turning now to FIG. 12, a circuit representation of an exemplary dual-rail decoder 870 (FIG. 9), in accordance with some embodiments, is illustrated. The signal decoder of FIG. 12 receives encoded dual-rail logic output into multiplexer 830 and multiplexer 840. The second input into the multiplexors 830, 840, are "0" input values. The signal "S-data" of FIG. 11 represents the serial data described above. The dual-rail logic output received are provided to an XOR gate 850, whose output is an "S-data Valid" signal, which represents the timeline when the signal has changed to a new value. This signal (S-data Valid) is provided to the select signal of the multiplexors 830 and 840.

Figures 13, 14A, 14B:
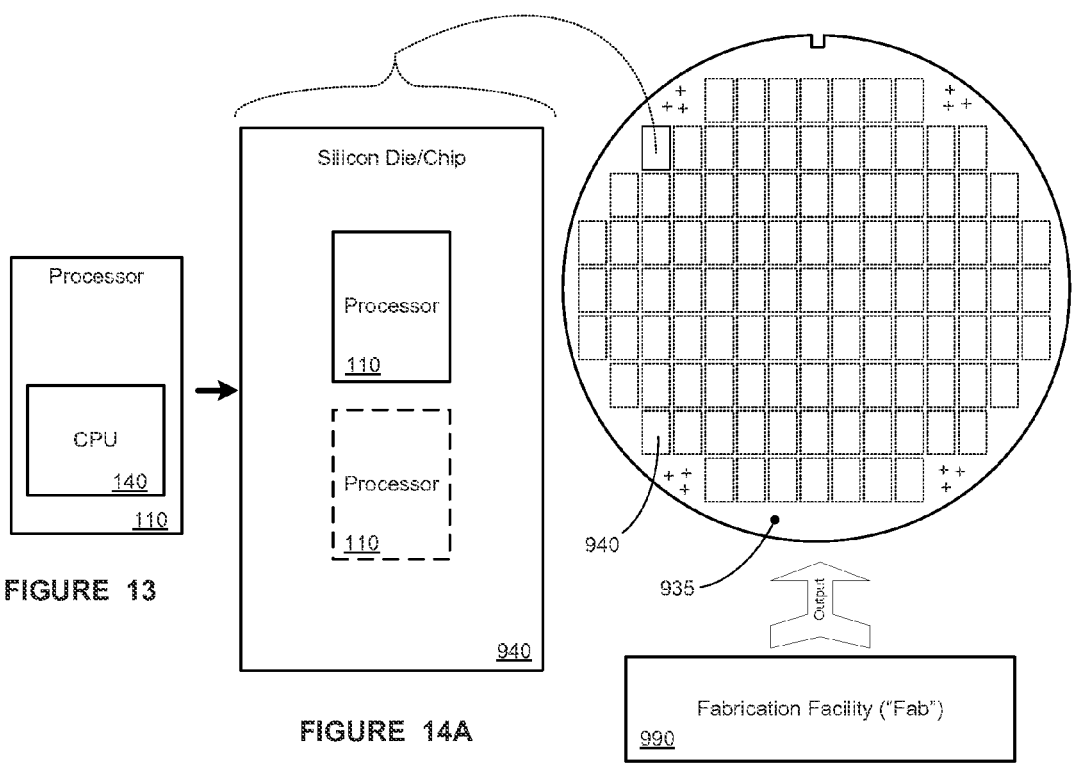
FIG. 13 provides a representation of a processor depicted in FIG. 4, in accordance with some embodiments.
FIG. 14A provides a representation of a silicon die/chip that includes one or more circuits as shown in FIG. 3, in accordance with some embodiments.
FIG. 14B provides a representation of a silicon wafer which includes one or more dies/chips that may be produced in a fabrication facility, in accordance with some embodiments.

The outputs of the multiplexors 830 and 840 provide the dual-rail output Out-0 and Out-1. The output dual-rail signal (Out-0 and Our-1) of FIG. 13 represents a serialized version of the dual-rail parallel signals of a bit value, as well as the additional single-rail bit. Therefore, the encoded dual-rail logic output received by the decoder of FIG. 12 may be decoded to provide the value of a dual-rail bit, as well as an additional signal (e.g., an index) on the dual-rail pair (Out-0 and Our-1).

The circuitry illustrated in FIGS. 10, 11, and 12 may be duplicated for the number of dual-rail pairs, bit-0 through b-N, as provided by the dual-rail transmitter 510. Therefore, additional information may be transmitted during a NULL state in addition to the dual-rail signal transmission of a bit, which provides for an increase in the bandwidth of dual-rail data channels.

Utilizing embodiments presented herein, dual-rail signals may be encoded in order to utilize a lower number of wires for transmission of dual-rail signal information, and/or provide for transmitting an additional data channel, along with the dual-rail bit value. In this manner, circuit resources may be conserved, and/or additional bandwidth for dual-rail signal communications may be provided utilizing the embodiments provided herein.

Turning now to FIG. 14 and FIG. 15A, in some embodiments, the processor 110 comprising a CPU 140 may reside on a silicon die/chip 640. The silicon die/chip 640 may be housed on a motherboard or other structure of the computer system 100. In some embodiments, there may be more than one processor 110 on each silicon die/chip 640. Some embodiments of the processor 110 may be used in a wide variety of electronic devices. In an alternative embodiment, the block CPU 140 may be a compute unit in a GPU, as exemplified in FIG. 4. The CPU 140 and the CU 126 may comprise the DRC 144 described above.

Turning now to FIG. 6B, in accordance with some embodiments, and as described above, the processor 110 may be included on the silicon chip/die 640. The silicon chip/die 640 may contain one or more different configurations of the processor 110. The silicon chip/die 640 may be produced on a silicon wafer 630 in a fabrication facility (or "fab") 690. That is, the silicon wafer 630 and the silicon die/chip 540 may be referred to as the output, or product of, the fab 690. The silicon chip/die 640 may be used in electronic devices.

The circuits described herein may be formed on a semiconductor material by any known means in the art. Forming may be done, for example, by growing or deposition, or by any other means known in the art. Different kinds of hardware descriptive languages (HDL) may be used in the process of designing and manufacturing the microcircuit devices. Examples include VHDL and Verilog/Verilog-XL. In some embodiments, the HDL code (e.g., register transfer level (RTL) code/data) may be used to generate GDS data, GDSII data and the like. GDSII data, for example, is a descriptive file format and may be used in some embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units, RAMs, compact discs, DVDs, solid state storage and the like) and, in some embodiments, may be used to configure a manufacturing facility (e.g., through the use of mask works) to create devices capable of embodying various aspects of some embodiments. As understood by one or ordinary skill in the art, this data may be programmed into a computer, processor, or controller, which may then control, in whole or part, the operation of a semiconductor manufacturing facility (or fab) to create semiconductor products and devices. In other words, some embodiments relate to a non-transitory computer-readable medium storing instructions executable by at least one processor to fabricate an integrated circuit. These tools may be used to construct the embodiments described herein.

Embodiments of processor systems that provide for the dual-rail encoding/decoding described above (such as the processor system 100) may be fabricated in semiconductor fabrication facilities according to various processor designs. In one embodiment, a processor design can be represented as code stored on a computer readable media. Exemplary codes that may be used to define and/or represent the processor design may include HDL, Verilog, and the like. The code may be written by engineers, synthesized by other processing devices, and used to generate an intermediate representation of the processor design, e.g., netlists, GDSII data and the like. The intermediate representation can be stored on computer readable media and used to configure and control a manufacturing/fabrication process that is performed in a semiconductor fabrication facility. The semiconductor fabrication facility may include processing tools for performing deposition, photolithography, etching, polishing/planarizing, metrology, and other processes that are used to form transistors and other circuitry on semiconductor substrates. The processing tools can be configured and are operated using the intermediate representation, e.g., through the use of mask works generated from GDSII data.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

Furthermore, the methods disclosed herein may be governed by instructions that are stored in a non-transitory computer readable storage medium and that are executed by at least one processor of a computer system. Each of the operations of the methods may correspond to instructions stored in a non-transitory computer memory or computer readable storage medium. In various embodiments, the non-transitory computer readable storage medium includes a magnetic or optical disk storage device, solid state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed:

1. A method comprising:
   receiving, at an encoder, a first signal representing a first bit;
   receiving, at the encoder, a second signal representing a second bit;
   encoding, at the encoder, said first and second bits into a first dual-rail signal that spans first, second, and third time periods, wherein said dual-rail signal comprises: a two-bit representation of a first wait state during said first time period; a two-bit representation of said first bit during said second time period; and a two-bit representation of both a second wait state and said second bit during said third time period; and
   providing said first dual-rail signal from the encoder to a dual-rail receiver via a first wire pair.

2. The method of claim 1, further comprising:
   determining, at a decoder receiving the first-rail signal, that said second wait state has occurred based upon the two-bit representation of said first wait state during said first time period.

3. The method of claim 2, wherein determining that said second wait state has occurred comprises at least one of:
   determining that said second wait state has occurred in response to determining said value is 00 in response to said second bit being 0; or
   determining that said second wait state has occurred in response to determining said value is 11 in response to said second bit being 1.

4. The method of claim 1, wherein:
   receiving said first signal and said second signal comprises receiving said first and second signals from a dual-rail transmitter over a first distance; and
   providing said first dual-rail signal comprises transmitting said first dual-rail signal over a second distance, wherein said second distance is greater than said first distance.

5. The method of claim 1, further comprising:
   receiving, at said encoder via a second wire pair, a third signal representing a third bit;
   receiving, at said encoder via a third wire pair, a fourth signal representing a fourth bit;
   encoding, at said encoder, said third and fourth bits into a second dual-rail signal that spans first, second, and third time periods, wherein said second dual-rail signal comprises a two-bit representation of a third wait state during said first time period, a two-bit representation of said third bit during said second time period, and, and a two-bit representation of both said fourth bit and a fourth wait state during said third time period; and
   providing said second dual-rail signal from said encoder to said dual-rail receiver via a second wire pair.

6. The method of claim 5, further comprising said dual-rail receiver asserting an acknowledgement signal during said second time period and de-asserting said acknowledgement signal during said third time period in response to receiving at least one of:
   said two-bit representation of said first bit during said second time period, said two-bit representation of said second wait state and said second bit during said third time period; or
   said two-bit representation of said third bit during said second time period, said two-bit representation of said second wait state during said third time period and said two-bit representation of said fourth bit during said third time period.

7. An apparatus comprising:
   a dual-rail converter comprising:
      an input to receive a first signal representing a first bit, and a second input to receive a second signal representing a second bit;
      an encoder operatively coupled to said first and second inputs, said encoder configured to encode said first and second signals into a dual-rail signal that spans first, second, and third time periods, wherein said dual-rail signal comprises a two-bit representation of a first wait state during said first time period, a two-bit representation of said first bit during said second time period, and a two-bit representation of both second wait state and said second bit during said third time period; and
      an output coupled to a first wire pair to transmit said dual-rail signal.

8. The apparatus of claim 7, wherein the two-bit representation of the second wait state is 00 in response to said second bit being 0 and wherein the two-bit representation of the second wait state is 11 in response to said second bit being 1.

9. The apparatus of claim 7, further comprising:
a dual-rail transmitter operatively coupled to said first and second inputs, wherein said dual-rail transmitter is configured to concurrently transmit a plurality of dual-rail signals indicative of a plurality of bits; and
a dual-rail receiver operatively coupled to said first wire pair, wherein said dual-rail receiver is configured to receive at least one encoded dual-rail signals.

10. The apparatus of claim 9, wherein said encoder is positioned at a first distance from said dual-rail transmitter, and at a second distance from said dual-rail receiver, wherein said second distance is greater than said first distance.

11. The apparatus of claim 7, further comprising:
a processor for executing an instruction, the processor coupled to said dual-rail converter.

12. The dual-rail encoder of claim 7, wherein:
the first input is coupled to a second wire pair to receive the first signal; and
the second input is coupled to a third wire pair to receive the second signal.

13. The method of claim 1, wherein:
receiving the first signal comprises receiving the first signal at the encoder via a second wire pair; and
receiving the second signal comprises receiving the second signal at the encoder via a third wire pair.

\* \* \* \* \*